United States Patent
DeYoung et al.

(10) Patent No.: US 8,153,533 B2
(45) Date of Patent: Apr. 10, 2012

(54) METHODS AND SYSTEMS FOR PREVENTING FEATURE COLLAPSE DURING MICROELECTRONIC TOPOGRAPHY FABRICATION

(75) Inventors: James P. DeYoung, Dallas, TX (US); Mark I. Wagner, Austin, TX (US)

(73) Assignee: Lam Research, Fremont, CA (US)

( * ) Notice: Subject to any disclaimer, the term of this patent is extended or adjusted under 35 U.S.C. 154(b) by 858 days.

(21) Appl. No.: 12/237,070

(22) Filed: Sep. 24, 2008

(65) Prior Publication Data
US 2010/0072169 A1    Mar. 25, 2010

(51) Int. Cl.
*H01L 21/302* (2006.01)
*H01L 21/461* (2006.01)

(52) U.S. Cl. ............. 438/745; 438/754; 216/58; 216/73

(58) Field of Classification Search .................. None
See application file for complete search history.

(56) References Cited

U.S. PATENT DOCUMENTS

| | | | |
|---|---|---|---|
| 4,948,685 A | | 8/1990 | Ohsawa et al. |
| 5,962,743 A | | 10/1999 | Gruber et al. |
| 6,100,203 A | * | 8/2000 | Kil et al. .................. 438/745 |
| 6,306,754 B1 | | 10/2001 | Agarwal |
| 6,558,475 B1 | | 5/2003 | Jur et al. |
| 6,562,146 B1 | | 5/2003 | DeYoung et al. |
| 6,576,066 B1 | | 6/2003 | Namatsu |
| 6,596,093 B2 | | 7/2003 | DeYoung et al. |
| 6,602,351 B2 | | 8/2003 | DeYoung et al. |
| 6,613,157 B2 | | 9/2003 | DeYoung et al. |
| 6,641,678 B2 | | 11/2003 | DeYoung et al. |
| 6,669,785 B2 | | 12/2003 | DeYoung et al. |
| 6,734,112 B2 | | 5/2004 | Worm et al. |
| 6,735,978 B1 | | 5/2004 | Tom et al. |
| 6,740,247 B1 | * | 5/2004 | Han et al. ........................ 216/73 |
| 6,763,840 B2 | | 7/2004 | DeSimone et al. |

(Continued)

FOREIGN PATENT DOCUMENTS

WO    2006113621    10/2006

(Continued)

OTHER PUBLICATIONS

International Search Report & Written Opinion, PCT/US2009/057490, mailed Mar. 19, 2010.

(Continued)

*Primary Examiner* — Duy Deo
(74) *Attorney, Agent, or Firm* — Kevin L. Daffer; Mollie E. Lettang; Daffer McDaniel, LLP

(57) ABSTRACT

Methods for preventing feature collapse subsequent to etching a layer encasing the features include adding a non-aqueous liquid to a microelectronic topography having remnants of an aqueous liquid arranged upon its surface and subsequently exposing the topography to a pressurized chamber including a fluid at or greater than its saturated vapor pressure or critical pressure. The methods include flushing from the pressurized chamber liquid arranged upon the topography and, thereafter, venting the chamber in a manner sufficient to prevent liquid formation therein. The topography features may be submerged in a liquid while pressurizing the chamber. A process chamber used to prevent feature collapse includes a substrate holder for supporting a microelectronic topography, a vessel configured to contain the substrate holder, and a sealable region surrounding the substrate holder and the vessel. The chamber is configured to sequester wet chemistry supplied to the vessel from metallic surfaces of the sealable region.

31 Claims, 3 Drawing Sheets

U.S. PATENT DOCUMENTS

| | | |
|---|---|---|
| 6,764,552 B1 | 7/2004 | Joyce et al. |
| 6,905,555 B2 | 6/2005 | DeYoung et al. |
| 6,953,041 B2 | 10/2005 | DeYoung et al. |
| 7,011,716 B2 | 3/2006 | Xu et al. |
| 7,022,655 B2 | 4/2006 | Brask et al. |
| 7,044,143 B2 | 5/2006 | DeYoung et al. |
| 7,119,052 B2 | 10/2006 | Korzenski et al. |
| 7,129,160 B2 * | 10/2006 | Chopra ......................... 438/627 |
| 7,141,496 B2 | 11/2006 | DeYoung et al. |
| 7,160,815 B2 | 1/2007 | Korzenski et al. |
| 7,223,352 B2 | 5/2007 | Korzenski et al. |
| 7,250,374 B2 | 7/2007 | Gale et al. |
| 7,291,565 B2 | 11/2007 | Hansen et al. |
| 2002/0014257 A1 | 2/2002 | Chandra et al. |
| 2002/0112740 A1 | 8/2002 | DeYoung et al. |
| 2002/0112746 A1 | 8/2002 | DeYoung et al. |
| 2002/0179126 A1 | 12/2002 | DeYoung et al. |
| 2003/0033676 A1 | 2/2003 | DeYoung et al. |
| 2003/0216269 A1 | 11/2003 | DeYoung et al. |
| 2004/0016450 A1 | 1/2004 | Bertram et al. |
| 2004/0020518 A1 | 2/2004 | DeYoung et al. |
| 2004/0045588 A1 | 3/2004 | DeYoung et al. |
| 2004/0050406 A1 | 3/2004 | Sehgal |
| 2004/0071873 A1 | 4/2004 | DeYoung et al. |
| 2005/0028927 A1 | 2/2005 | Basceri et al. |
| 2005/0181135 A1 | 8/2005 | Ivanov et al. |
| 2006/0003592 A1 | 1/2006 | Gale et al. |
| 2006/0019850 A1 | 1/2006 | Korzenski et al. |
| 2006/0180572 A1 | 8/2006 | Jacobson et al. |
| 2006/0186088 A1 | 8/2006 | Jacobson et al. |
| 2006/0194404 A1 | 8/2006 | Dupont et al. |
| 2007/0095367 A1 | 5/2007 | Wang et al. |
| 2007/0249156 A1 | 10/2007 | Bonilla et al. |
| 2007/0293054 A1 | 12/2007 | Lee et al. |
| 2010/0184301 A1 * | 7/2010 | Wagner et al. ................ 438/754 |

FOREIGN PATENT DOCUMENTS

| | | |
|---|---|---|
| WO | 2006138505 | 12/2006 |

OTHER PUBLICATIONS

International Search Report & Written Opinion, PCT/US2010/020093, mailed Jul. 22, 2010.

Goldfarb et al., "Aqueous-based photoresist drying using supercritical carbon dioxide to prevent pattern collapse," J. Vac. Sci. Technol. B, vol. 18, No. 6, Nov./Dec. 2000, pp. 3313-3317.

International Search Report & Written Opinion, PCT/US2010/020086, mailed Aug. 9, 2010.

Office Action mailed Apr. 29, 2011 for U.S. Appl. No. 12/356,143.

McClain et al., "Design of Nonionic Surfactants for Supercritical Carbon Dioxide," Science, vol. 274, Dec. 1996, pp. 2049-2052.

Harris, "Quantitative Chemical Analysis," © 2010 W.H. Freeman & Company, pp. AP14-AP19.

Office Action mailed Jun. 20, 2011 for U.S. Appl. No. 12/356,170.

Final Office Action mailed Oct. 17, 2011 for U.S. Appl. No. 12/356,170.

Final Office Action mailed Nov. 9, 2011 for U.S. Appl. No. 12/356,143.

* cited by examiner

METHODS AND SYSTEMS FOR PREVENTING FEATURE COLLAPSE DURING MICROELECTRONIC TOPOGRAPHY FABRICATION

BACKGROUND OF THE INVENTION

1. Field of the Invention

This invention generally relates to methods and systems for processing a microelectronic topography and, more specifically, to methods and systems for preventing feature collapse subsequent to etching a sacrificial layer encasing the features.

2. Description of the Related Art

The following descriptions and examples are not admitted to be prior art by virtue of their inclusion within this section.

The fabrication of microelectronic topographies generally comprises a plurality of processing steps including but not limited to depositing, patterning, and etching materials to form a compilation of device structures. In some embodiments, conductive structures may be formed within a sacrificial layer of a microelectronic topography and then portions or all of the sacrificial layer may be subsequently removed, exposing the sidewalls of the conductive structures. Thereafter, the microelectronic topography may be rinsed with deionized water to remove the etching solution and/or byproducts and subsequently dried. In some cases, the rinsing and drying processes may cause the conductive structures to collapse (i.e., topple towards each other) rendering the microelectronic topography unusable. The occurrence of feature collapse appears to be increasing, particularly as width dimensions of structures continue to decrease and resulting aspect ratios increase with the ever pressing goal to increase processing speed memory density of integrated circuits. In particular, it appears that the width dimensions of conductive structures may, in some embodiments, be decreased to an extent that surface tension of water between the conductive structures causes the conductive structures to collapse during a drying process.

In effort to inhibit such damage, rinse solutions having lower surface tensions than deionized water have been used to rinse microelectronic topographies subsequent to an etch process. Although such a technique has been effective for some fabrication processes, the technique is susceptible to the same detriments as rinsing with deionized water. In particular, although the rinse solutions have lower surface tensions than deionized water, the solutions do possess some level of surface tension and, thus, are susceptible to causing feature collapse, particularly as width dimensions of features continue to decrease. In addition, some etch solutions and/or byproducts may not be as soluble in rinse solutions having lower surface tensions (i.e., as compared to deionized water) and, thus, such rinse solutions may not be as effective for removing residual etching matter. As such, an alternative technique often used for inhibiting feature collapse is to dry a microelectronic topography rinsed with deionized water in an environment of a supercritical fluid, since supercritical fluids are generally free of surface tension. Although such a technique has shown to reduce the occurrence of feature collapse, it has not proven to reliably eliminate it.

As such, it would be advantageous to develop methods and systems which reliably prevent feature collapse within a microelectronic topography while rinsing and drying device structures, particularly subsequent to etching a sacrificial layer encasing the structures.

SUMMARY OF THE INVENTION

The problems outlined above may be in large part methods and systems for preventing feature collapse subsequent to etching a sacrificial layer encasing the features. The following are mere exemplary embodiments of methods and systems, but are not to be construed in any way to limit the subject matter of the claims.

Embodiments of methods for preventing feature collapse include adding a non-aqueous liquid chemical formulation to a microelectronic topography having remnants of an aqueous liquid arranged upon its surface. Such a process may be particularly performed subsequent to using a solution of deionized water to rinse etch solution and byproducts from the surface of the microelectronic topography. The methods additionally include transferring the microelectronic topography to a process chamber configured to generate and withstand pressures greater than approximately 1000 psig such that the microelectronic topography may be dried. In some embodiments, the microelectronic topography may be transferred to the chamber prior to exposure to the non-aqueous liquid chemical formulation. In other cases, the microelectronic topography may be transferred to the chamber prior to exposure to the deionized water rinse or prior to an etch process used to remove a sacrificial layer encasing device structures comprising an upper surface the microelectronic topography. In yet other embodiments, the microelectronic topography may be transferred to the chamber subsequent to exposure to the non-aqueous liquid chemical formulation. In at least the latter case, the non-aqueous liquid chemical formulation may be added such that device structures comprising the microelectronic topography are submerged below a liquid-gas interface.

Regardless of the timing of the transfer of the microelectronic topography to the process chamber, the methods include introducing a first flow of a fluid in a gas state into the process chamber subsequent to adding the non-aqueous liquid chemical formulation to the microelectronic topography. The fluid is added to the process chamber at least until a chamber pressure equal to or greater than a saturated vapor pressure of the fluid or the critical pressure value of the fluid is attained. In some embodiments, the methods may include keeping the device structures of the microelectronic topography submerged in a liquid including at least one component of the non-aqueous liquid chemical formulation while pressurizing the process chamber. In any case, the methods further include introducing a second flow of the fluid into the process chamber at least subsequent to attaining saturated vapor pressure or critical pressure within the process chamber. Moreover, the methods include venting the process chamber at approximately the same rate as introducing the second flow of the fluid into the process chamber such that pressure within the process chamber is maintained at or above saturated vapor pressure or critical pressure of the fluid. Such a venting process includes flushing liquid which was added to the microelectronic topography prior to or during the introduction of first flow of the fluid into the process chamber.

Subsequent thereto, the second flow of the fluid into the process chamber is ceased and the process chamber is vented in a manner sufficient to prevent formation of a liquid in the process chamber. It is noted that the methods further include processes for providing a heated environment within the process chamber such that the fluid within the process chamber is at a temperature above the critical temperature of the fluid at least subsequent to ceasing the introduction of the second flow of the fluid into the process chamber and, in some embodiments, prior to or during the introduction of the first and/or second flows of the fluid into the process chamber.

An embodiment of a process chamber used to prevent feature collapse includes a substrate holder configured to support a microelectronic topography, a vessel configured to contain the substrate holder, and a sealable region surrounding the substrate holder and the vessel. The process chamber is configured to generate and withstand pressures greater than approximately 1000 psig within the sealable region. Moreover, the process chamber is configured to supply wet chemistry to the vessel as well as sequester the wet chemistry from metallic sidewall surfaces of the sealable region.

BRIEF DESCRIPTION OF THE DRAWINGS

Other objects and advantages of the invention will become apparent upon reading the following detailed description and upon reference to the accompanying drawings in which.

Figure 1:
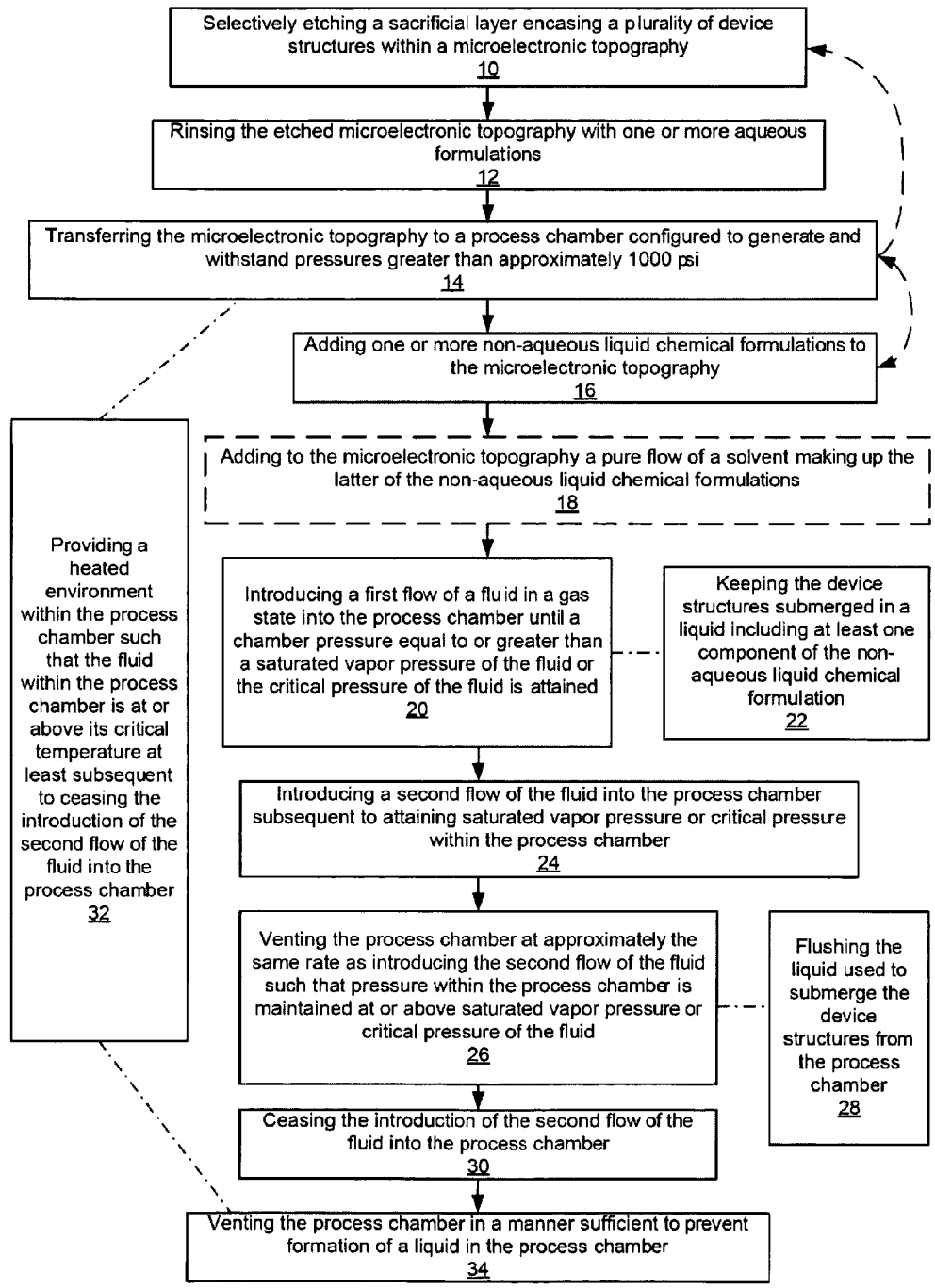
FIG. 1 depicts a flowchart of an exemplary method for processing a microelectronic topography.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 7:
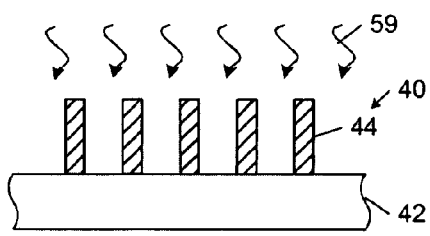
FIG. 7 depicts a cross-sectional view of the partial and exemplary microelectronic topography depicted in FIG. 6 subsequent to a venting process used to transform a supercritical fluid in the ambient of the microelectronic topography into a gas state or flush the supercritical fluid from a process chamber comprising the microelectronic topography in a flow-through process.
Figure 8:
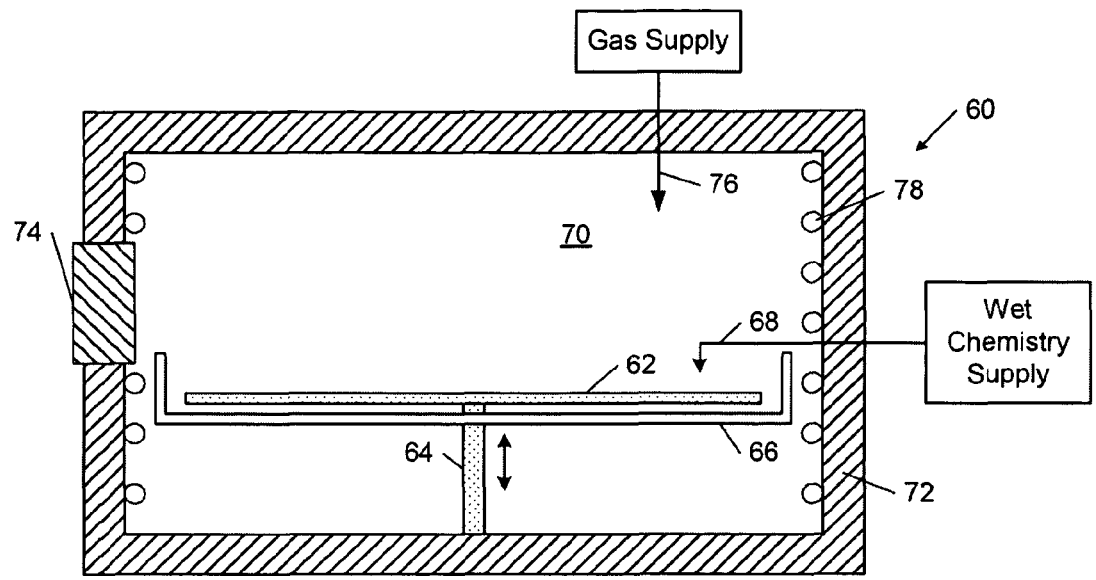
FIG. 8 depicts a cross-sectional view of an exemplary process chamber configured for processing a microelectronic topography.

Turning now to the drawings, exemplary embodiments of methods and systems for preventing feature collapse within microelectronic topographies are illustrated and described in reference to FIGS. 1-8. In particular, a flowchart of an exemplary method for preventing feature collapse within a microelectronic topography is depicted in FIG. 1. FIGS. 2-7 illustrate cross-sectional views of partial and exemplary microelectronic topographies during intermediate stages of the method outlined in FIG. 1 and, thus, are discussed in conjunction with FIG. 1. It is noted in reference to FIGS. 2-7 that elements shown in more than one figure and that may be similarly configured have been indicated using the same reference numerals. FIG. 8 illustrates an exemplary process chamber for performing one or more of the process steps of the methods described herein. Specific details and various embodiments of the methods and the solutions and systems used in reference to such methods are provided below in reference to the figures.

It is noted that the methods described herein are not necessarily limited to the flowchart depicted in FIG. 1. In particular, the methods described herein may include additional steps not shown in FIG. 1 for the fabrication of a microelectronic device and/or a circuit, including steps performed prior to, intermediate to, and/or after the steps shown in FIG. 1. In addition, the methods described herein may be applied to microelectronic topographies having configurations different from those illustrated in FIGS. 2-7. The term "microelectronic topography", as used herein, may generally refer to a topography having one or more layers and/or structures used to form a microelectronic device and/or circuit. As such, the term may refer to topographies used at any stage during fabrication of a microelectronic device and/or circuit. A microelectronic topography may alternatively be referred to as a "semiconductor topography" and, as such, the terms are used interchangeably herein.

Furthermore, process chambers used to perform one or more of the process steps of the methods described herein are not restricted to FIG. 8. For instance, a process chamber may include additional or alternative components not shown in the figure. It is also noted that the components of the process chamber depicted in FIG. 8 are not necessarily drawn to scale and the chamber and the components comprising the chamber may include different configurations. In addition, the topographies illustrated in FIGS. 2-7 are not necessarily drawn to scale. In particular, the scale of some layers and/or structures in some of the figures may be greatly exaggerated to emphasize characteristics of the topographies. Furthermore, the layers depicted in the figures may extend to other regions of the semiconductor topography as indicated by the curved lateral edges of the layers. As such, the methods and systems described herein are not necessarily limited to the depictions in the figures.

Figure 2:
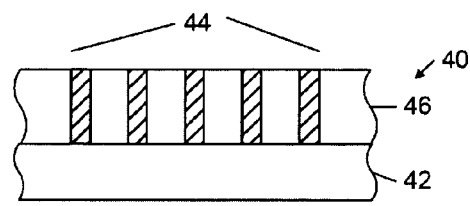
FIG. 2 depicts a cross-sectional view of a partial and exemplary microelectronic topography having device structures encased within a sacrificial layer.
Figure 3:
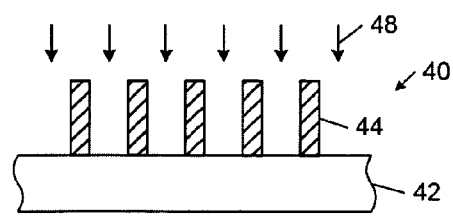
FIG. 3 depicts a cross-sectional view of the partial and exemplary microelectronic topography depicted in FIG. 2 subsequent to the sacrificial layer being removed.

As shown in block 10 of FIG. 1, the methods described herein may include selectively etching a sacrificial layer encasing a plurality of device structures within a microelectronic topography. A partial cross-sectional view of an exemplary microelectronic topography to which such a selective etch process may be applied is illustrated in FIG. 2 and a topography resulting from the selective etch process is illustrated in FIG. 3. As shown in FIG. 2, microelectronic topography 40 may include sacrificial layer 46 arranged upon semiconductor layer 42 and encasing device structures 44. In some embodiments, semiconductor layer 42 may be a semiconductor substrate such as a monocrystalline silicon, gallium-arsenic, indium phosphide, silicon-germanium, silicon-on-insulator, or silicon-on-sapphire substrate. In such cases, semiconductor layer 42 may be doped either n-type or p-type and, in some embodiments, diffusion regions and/or isolation regions may be formed therein. In other cases, semiconductor layer 22 may include structures and layers formed upon a semiconductor substrate. The structures and layers may include, but are not limited to, dielectric layers, metallization layers, gate structures, contact structures, vias, or local interconnect wires.

The material of device structures 44 may include any material used in the semiconductor industry for conductive device structures, including but not limited to polysilicon, aluminum, copper, titanium, titanium nitride, tungsten, and/or any alloys thereof. Although the methods described herein may be applied to topographies having device structures of any dimension, the methods may be particularly applicable to topographies having devices structures with aspect ratios equal to or greater than approximately 10:1, since device structures with such aspect ratios are generally more susceptible to feature collapse. The term "aspect ratio," as used herein, may generally refer to a ratio of height to width of a feature. Exemplary widths for device structures 44 may be between approximately 10 nm and approximately 100 nm and exemplary spacings between device structures 44 may be between approximately 15 nm and approximately 35 nm. Widths and/or spacings of other dimensions, however, may be considered, particularly as technology develops to decrease device dimensions. Although not necessarily so limited, device structures 44 may, in some embodiments, be formed by a damascene process. In particular, the material of the device structures may be deposited within trenches of sacrificial layer 46 and the topography may be subsequently polished to remove portions of the device structure material on the upper surface of the sacrificial layer resulting in the topography illustrated in FIG. 2.

In general, sacrificial layer 46 may include any material which may be selectively removed relative to the material of device structures 44 for the process outlined in block 10 of FIG. 1. Exemplary materials include but are not limited to silicon dioxide ($SiO_2$), tetraorthosilicate glass (TEOS), silicon nitride ($Si_xN_y$), silicon oxynitride ($SiO_xN_y(H_z)$), silicon dioxide/silicon nitride/silicon dioxide (ONO) or, in general, any oxide layer. The term "oxide layer," as used herein, may generally refer to a layer including oxygen atoms incorporated therein. In any case, sacrificial layer 46 may be doped or updoped. As such, in some embodiments, sacrificial layer 46 may include borophosphorus silicate glass (BPSG), phosphorus silicate glass (PSG), or fluorine silicate glass (FSG).

In general, the selective etch process may remove portions of sacrificial layer 46 adjacent to device structures 44 such that sidewall surfaces of the device structures are exposed. As shown in FIG. 3, selective etch process 48 may, in some cases, be conducted such that device structures 44 are free standing. In any case, it is noted that device structures 44 comprise an upper surface of microelectronic topography 40. The selective etch process may remove the entirety of sacrificial layer 46 across microelectronic topography 40 or may only remove a portion of sacrificial layer 46 in the vicinity of device structures 44. In the latter embodiment, portions of sacrificial layer 46 slated to remain within microelectronic topography 40 (i.e., the portions of sacrificial layer 46 not in the vicinity of device structures 44) may be masked for the selective etch process.

In any case, the selective etch process may include a wet or dry etch process and may employ chemistries applicable for removing sacrificial layer 46 while substantially retaining device structures 44. An exemplary dry etch process may employ, for example, a chlorine or fluorine-based plasma etchant, such as $CF_4$ and/or $CHF_3$. Alternatively, an exemplary wet etch process may employ, for example, a solution of concentrated hydrogen fluoride. For instance, a solution having a weight concentration of hydrogen fluoride between approximately 1.0% and approximately 49.5% or, more specifically, between approximately 5.0% and 24.5% with a balance of water may be used. In some embodiments, a wet etch solution may include a buffering agent, such as ammonium fluoride at a weight concentration between approximately 0.5% and approximately 25%. In general, a wet etch process may be performed at or near atmospheric pressure, but a dry etch process may involve various pressures depending on the technique used. The duration of the selective etch process may generally depend on the type of etch process and etchant used, but an exemplary period may be between approximately 20 seconds and approximately 1 minute.

Figure 4:
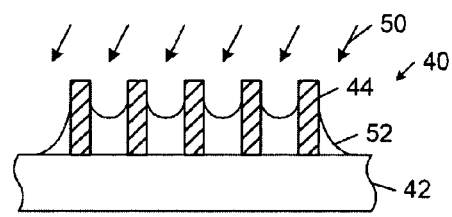
FIG. 4 depicts a cross-sectional view of the partial and exemplary microelectronic topography depicted in FIG. 3 having remnants of an aqueous liquid arranged upon the topography's surface due to exposure to a deionized water rinse process.

As shown in block 12 of FIG. 1 and rinse process 50 in FIG. 4, the method may include rinsing the etched microelectronic topography with one or more aqueous liquid formulations subsequent to the selective etch process. Such a process may generally be used to remove residual etch solution and/or etch byproducts from the topography and, in some embodiments, may further serve as a transitional rinse to lower the surface tension of the liquid. The duration of rinse process 50 may vary, but may generally be less than approximately 60 seconds. In some cases, rinse process 50 may employ a single rinse formulation (i.e., a single aqueous liquid formulation without having its composition altered during the rinse process). In alternative embodiments, rinse process 50 may employ multiple and different rinse formulations successively added to microelectronic topography 40. In particular, rinse process 50 may include sequentially adding aqueous liquid formulations having varying concentrations of deionized water to microelectronic topography 40. In yet other cases, rinse process 50 may include gradually changing the composition of a rinse solution added to the microelectronic topography (e.g., by changing the concentration of water in the solution). In this manner, the rinse solution on the microelectronic topography and its associated surface tension may be changed in a linear fashion as opposed to a graduated manner.

In any case, it may in some cases be advantageous to employ an aqueous rinse formulation which primarily includes deionized water and, in some cases, consists essentially of deionized water at least some point during rinse process 50 and, in some cases, specifically at the beginning of the rinse process. In particular, since etch solutions and byproducts may sometimes be more soluble with water than other liquid rinse materials, having such a high concentration of water may allow the solutions and byproducts to be more easily removed from the microelectronic topography. As such, in cases in which rinse process 50 includes multiple and different rinse formulations successively added to microelectronic topography 40, it may in some embodiments be advantageous for the first rinse formulation added to the topography to primarily include deionized water and, in some cases, consist essentially of deionized water. Alternatively, in cases in which the composition of a rinse solution is changed during rinse process 50, the process may start with a rinse formulation which primarily includes deionized water and, in some cases, consist essentially of deionized water and then gradually add larger concentrations of another liquid solvent thereto. Despite the aforementioned advantage, it is noted that a rinse formulation having less than a primary concentration of deionized water may be employed at the beginning of rinse process 50 (as well as other stages of rinse process 50) in some embodiments and may be advantageous in its own right depending on the specifications of the fabrication process.

In any case, as noted above, rinse process 50 may in some cases include adding rinse formulations having varying concentrations of deionized water to microelectronic topography 40 or may include gradually changing the composition of a rinse solution added to microelectronic topography 40 by changing the concentration of water in the solution. In such embodiments, the balance of the one or more aqueous liquid formulations (i.e., components other than deionized water) may include one or more liquid materials having lower surface tensions than deionized water. Suitable materials include polar or non-polar solvents and solvent mixtures including but not limited to hexane, pentane, heptane, methanol, ethanol, propanol, isopropanol, and acetone.

Further to such cases, the rinse formulation/s may in some embodiments be configured to decrease the concentration of deionized water added to microelectronic topography 40 as rinse process 50 progresses. It is theorized such a configuration of rinse process 50 may advantageously allow etch solutions and byproducts to be easily removed from the microelectronic topography through the use of a formulation having a primary concentration of deionized water at the beginning stages of the rinse process, but then reduce the surface tension of the rinse solution on the microelectronic topography thereafter. Reducing the surface tension of the rinse solution on the microelectronic topography may advantageously aid in preventing feature collapse of device structures 44. Furthermore, it is believed that a step-wise or gradual decrease in concentration of deionized water added to microelectronic topography 40 as rinse process 50 progresses may advantageously allow the rinse solution on the topography to be substantially homogeneous and, thus, distinct liquid-liquid interfaces of deionized water and solvents may be avoided, which as described in more detail below may aid in preventing feature collapse as well.

In some embodiments, the rinse formulation/s may be specifically configured to have less than a primary concentration of deionized water at the end of rinse process 50. For example, a formulation primarily including or consisting essentially of deionized water may first be added to the microelectronic topography. Then, a 1:1 ratio of an ethanol:water solution may be added followed by a solution having a 9:1 ratio of ethanol to water. In alternative embodiments, increasing amounts of ethanol may be added to the flow of the deionized water formulation as the rinse process progresses, in effect gradually lowering the concentration of water within the rinse formulation (e.g., from 95% water to 5% water). It is noted that the number of solvents and the number of formulations thereof added to the topography as well as the relative amounts and citation of ethanol noted above are merely cited for exemplary purposes and, thus, the methods described herein should not be limited to such examples. Furthermore, it is noted that in some embodiments, the relative amounts of deionized water in the rinse formulation/s added to the microelectronic topography may not successively decrease as the rinse process progresses and, thus, the methods described herein should not be so limited.

In any case, as shown in FIG. 4, remnants 52 of an aqueous liquid may remain upon semiconductor layer 42 surrounding devices structures 44 subsequent to rinse process 50. As noted above, due to the surface tension of water, remnants 52 may, in some embodiments, cause device structures 44 to collapse if microelectronic topography 40 is exposed to a conventional drying process, such as spinning the topography and/or exposing the topography to elevated temperatures at or near atmospheric pressure. The methods described herein, however, avoid such detrimental effects by exposing microelectronic topography 40 to an alternative sequence of process steps, which are outlined in blocks 16-34 of FIG. 1 and described in more detail below. It is further noted that rinsing microelectronic topography 40 with a rinse formulation having less than a primary concentration of deionized water at the end of rinse process 50 as described above may additionally aid in avoiding feature collapse using the methods described herein.

Although not shown in FIG. 4, in some embodiments it may be advantageous to submerge device structures 44 within remnants 52 of the aqueous liquid to aid in preventing feature collapse. In particular, submerging device structures 44 within remnants 52 may insure sufficient depth of the aqueous liquid on microelectronic topography 40 to prevent the topography from drying (e.g., by evaporation or movement of the aqueous liquid) prior to performing the sequence of process steps outlined in blocks 16-34 of FIG. 1. Such depth to the aqueous liquid may be particularly beneficial if the topography is transferred to a process chamber directly subsequent to rinse process 50. In particular, due to the time and exposure to drafty conditions, remnants of an aqueous liquid on a microelectronic topography may be apt to evaporate during a transfer process. It is noted, however, that aqueous liquids generally have low volatility and, thus, concerns of a microelectronic topography drying prior to performing the process sequence in blocks 16-34 of FIG. 1 are not great. Furthermore, as noted below, the methods described herein may in some cases not include transferring microelectronic topography 40 subsequent to rinse process 50 (i.e., rinse process 50 and selective etch process 48 may be performed in the process chamber used to dry the topography). As such, submersion of device structures 44 within an aqueous liquid is not necessarily required, but rather is presented as an optional course of action for rinse process 50.

In some cases, drying microelectronic topography 40 may not be the primary factor contributing to feature collapse. In particular, it is postulated that, as device widths of device structures and spacing therebetween continue to decrease and their aspect ratios continue to increase (e.g., aspect ratios on the order of approximately 20:1 or greater), interfacial tension may cause device structures to collapse prior to a topography drying. More specifically, it is hypothesized that, in some embodiments, the mere exposure of device structures 44 to a liquid-gas interface between an aqueous liquid and ambient air may increase the likelihood of feature collapse. As such, in some cases, it may be advantageous to prevent device structures 44 from being exposed to ambient air and, thus, keep the device structures submerged within the aqueous liquid prior to performing the process sequence in blocks 16-34 of FIG. 1.

As noted above, in some embodiments, rinsing microelectronic topography 40 with a solution of deionized water may be particularly advantageous prior to adding a non-aqueous liquid chemical formulation to the microelectronic topography (i.e., the process denoted in block 16 and described in more detail below). In particular, deionized water is generally a better solvent for removing residual etch solution and/or etch byproducts resulting from the selective etch process 48 than the non-aqueous liquid chemical formulation used for the process outlined in block 16. It is contemplated, however, that rinse process 50 may be omitted from the method described herein. In particular, the method may instead continue directly to block 14 or 16 after etching microelectronic topography 40, depending on the specifications of the fabrication process. In such embodiments, device structures 44 may still be susceptible to collapsing if a conventional drying process is subsequently employed and, as such, the use of the process steps outlined in blocks 18-34 may be beneficial as an alternative.

As shown in block 14 of FIG. 1, the methods described herein include transferring the microelectronic topography to a process chamber configured to generate and withstand pressures greater than approximately 1000 psig. As described in more detail below with respect to the processes outlined in blocks 20-34, such a process chamber may be particularly suitable for exposing the microelectronic topography to a fluid in a pressurized state such that liquid may be removed from the surfaces of the topography without causing feature collapse. An exemplary process chamber having such configurations is shown in FIG. 8 and described in more detail below. As noted by the dotted line arrows extending from block 14 in FIG. 1, the methods described herein are not limited to the transfer process occurring directly after the aqueous rinse process outlined in block 12. In particular, microelectronic topography 40 may alternatively be loaded into the process chamber prior to the selective etch process outlined in block 10. In such cases, the process chamber may be configured to perform the selective etch process and aqueous rinse process. In yet other embodiments, microelectronic topography 40 may be transferred to the process chamber after one or more non-aqueous liquid chemical formulations are added to the topography, a process which is outlined in block 16 of FIG. 1 and described in more detail below.

In some cases, however, it may be advantageous to transfer a topography to the process chamber prior to the addition of the one or more non-aqueous liquid chemical formulations. As set forth below, the one or more non-aqueous liquid chemical formulations are configured such that the surface tension of the resulting liquid formulation on microelectronic topography 40 is less than deionized water and, more specifically, less than aqueous liquid remnants 52. In order to accomplish such an objective, the one or more non-aqueous liquid chemical formulations are generally configured to have low surface tension and, thus, have a relatively high volatility. Due to the potential of the non-aqueous liquid chemical formulations evaporating during a transfer process (due to the time and exposure to air involved in the transfer process), device structures 44 may be exposed and, in some cases, microelectronic topography 40 may be dried if the topography is laced with a non-aqueous liquid chemical formulation. As a result, the likelihood of feature collapse may be high. It is believed that transferring a topography laced with an aqueous liquid, such as described in reference to remnants 52 in FIG. 4, may be less susceptible to feature collapse due to the relatively low volatility of water even if device structures 44 are not completely submerged. Thus, it may be advantageous to transfer microelectronic topography 40 to the process chamber prior to the addition of the one or more non-aqueous liquid chemical formulations.

In some embodiments, it may be advantageous to transfer microelectronic topography 40 to the process chamber in between intermediate stages of aqueous rinse process 50 (between successive additions of different aqueous liquid formulations), particularly if the process dilutes the water concentration in the rinse solution in the later stages of the process. In general, lower concentrations of water in an aqueous rinse solution may make the rinse solution more volatile and, thus, device structures 44 may be more susceptible to feature collapse during the later stages of the rinse process in such cases. In yet other cases, it may be advantageous to transfer microelectronic topography 40 to the process chamber prior to selective etch process 48. In this manner, concerns of exposure of the topography during a transfer process may be obviated. In any case, it is noted that the transfer process outlined in block 14 of FIG. 1 is not depicted among the views of microelectronic topography 40 in FIGS. 2-7, since such figures are used to show direct processing of the topography.

Figure 5:
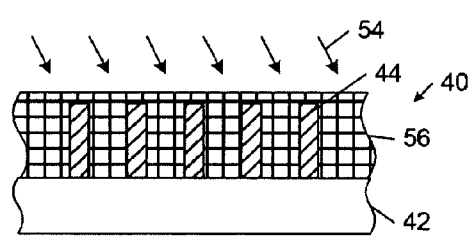
FIG. 5 depicts a cross-sectional view of the partial and exemplary microelectronic topography depicted in FIG. 4 having the device structures of the topography submerged within a non-aqueous liquid chemical formulation.
Figure 6:
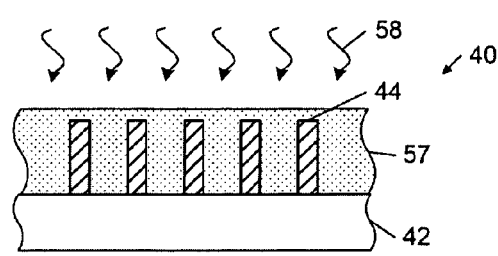
FIG. 6 depicts a cross-sectional view of the partial and exemplary microelectronic topography depicted in FIG. 5 subsequent to a venting process for removing the non-aqueous liquid chemical formulation from the microelectronic topography.

Continuing to FIG. 5 and block 16 of FIG. 1, one or more non-aqueous liquid chemical formulations are added to microelectronic topography 40. Such a process 54 is used to remove, emulsify, and/or dissolve aqueous remnants 52 such that the surface tension of resulting liquid formulation 56 on microelectronic topography 40 is less than deionized water and, more specifically, less than aqueous liquid remnants 52. In general, the addition of the one or more non-aqueous liquid chemical formulations may be performed at or near atmospheric pressure or at an ambient pressure of the environment in which the process chamber resides. In other words, process 54 is performed prior to pressurizing the process chamber. In some cases, non-aqueous liquid chemical formulation process 54 may be configured (i.e., via the composition of the formulation and/or duration of the process) such that the surface tension of resulting liquid formulation 56 on microelectronic topography 40 is equal to or less than approximately 30 dynes/cm. In particular, it was discovered during the development of the methods and solutions described herein that such a range of surface tension for resulting liquid formulation 56 may substantially reduce the likelihood of feature collapse prior to and/or during the subsequent drying process outlined in blocks 20-34 as described in more detail below. Such results, however, are not necessarily exclusive to such a surface tension range for all topographies and, thus, surface tensions greater than approximately 30 dynes/cm and less than the surface tension of water may be considered.

Another aspect of non-aqueous liquid chemical formulation process 54 which was discovered to be beneficial for inhibiting feature collapse during the development of the methods and solutions described herein is to configure the process such that device structures 44 are submerged in resulting liquid formulation 56, as shown in FIG. 5. The amount of resulting liquid formulation 56 above the upper surfaces of device structures 44 may generally vary among applications. In some embodiments, however, it may be particularly advantageous for the upper surfaces of device structures 44 to be below the liquid-gas interface created by resulting liquid formulation 56 (i.e., the upper surface of resulting liquid formulation 56) by at least approximately 3 mm and, in some cases, between approximately 3 mm and approximately 25 mm and, more specifically, between approximately 5 mm and approximately 12 mm. In particular, it was discovered during the development of the methods and solutions described herein that such ranges may be particularly beneficial for preventing feature collapse prior to and/or during the subsequent drying process. In some cases, however, smaller submerging buffers may be considered.

Without being bound to theory, it is hypothesized that such a submersion range may be sufficient to prevent microelectronic topography 40 from drying prior to venting the process chamber to flush the liquid from the chamber, the process of which is described in more detail below in reference to blocks 26 and 28 of FIG. 1. In particular, it is believed that the subsequent processes of pressurizing the process chamber (i.e., the process outlined in block 20 of FIG. 1) and introducing a second flow of the fluid into the process chamber subsequent to attaining saturated vapor pressure or critical pressure within the process chamber (i.e., the process outlined in block 24 of FIG. 1) may inadvertently cause liquid formulation 56 to be removed (e.g., by evaporation and/or movement of liquid formulation 56). It is theorized that such premature drying action may, in some instances, cause device structures 44 to collapse and, thus, providing a buffer of liquid formulation 56 at least 3 mm above upper surfaces of devices structures 44 may be advantageous.

In some cases, such a submersion range may not only be sufficient to prevent microelectronic topography from being dried during the processes of blocks 20 and 24, but the submersion range may be sufficient to prevent device structures from being exposed during such subsequent processing. Alternatively stated, the submersion range may be sufficient to keep device structures 44 submerged within liquid formulation 56 during the processes of blocks 20 and 24, depending on the parameters of such processes. It is theorized that, in some embodiments, the mere exposure of device structures 44 to an interfacial tension between liquid formulation 56 and the ambient of the process chamber and/or another liquid may cause device structures 44 to collapse. Thus, adding the non-aqueous liquid chemical formulation to microelectronic topography 40 in a sufficient amount such that device structures 44 are submerged during subsequent process may be advantageous. In addition or alternatively, the method may include configurations for maintaining a liquid buffer above upper surfaces of devices structures 44 during subsequent processing as described below in reference to block 22 of FIG. 1.

It is noted that submerging device structures 44 in liquid formulation 56 is not necessarily required for the methods described herein. In particular, the methods may alternatively include adding one or more non-aqueous liquid chemical formulations to microelectronic topography 40 such that liquid formulation 56 is at a level below the upper surfaces of device structures 44 for process 54. More specifically, it is theorized that the likelihood that microelectronic topography 40 may be dried or device structures 44 may be exposed prior to the venting process described in reference to blocks 26 and 28 of FIG. 1 and, thus, the likelihood that device structures 44 may be susceptible to feature collapse, may be dependent on the widths and/or aspect ratios of device structures 44 and/or the widths and/or aspect ratios of spacings therebetween. In particular, in the development of the methods and solutions described herein, feature collapse did not occur in all cases in which device structures were not submerged in liquid formulation 56, but appeared to be more prevalent for smaller widths and/or larger aspect ratios. A particular range of widths and/or aspect ratios requiring device structure submersion was not investigated, but it is noted that such an endeavor would not require undue experimentation of one skilled in the art based on the teachings provided herein. As such, submersion of device structures 44 within liquid formulation 56 is not necessarily required, but rather is presented as an optional course of action for process 54.

In general, the one or more non-aqueous liquid chemical formulations added to microelectronic topography 40 during process 54 include a drying agent and a solvent. The term "drying agent", as used herein, generally refers to a chemical substance that has an affinity for water such that water may be dissolved or emulsified in solution. In some embodiments, the drying agent and the solvent of a non-aqueous liquid chemical formulation may be the same agent. Alternatively stated, a non-aqueous liquid chemical formulation may include a solvent having the functionality of a drying agent. In embodiments in which such a non-aqueous liquid chemical formulation is the only non-aqueous liquid chemical formulation used in process 54, water is preferably miscible with the drying agent/solvent and the drying agent/solvent is preferably soluble in the fluid used to subsequently pressurize the process chamber (i.e., the fluid used in the process outlined in block 20 of FIG. 1 and described in more detail below). In alternative cases, the drying agent and the solvent making up a non-aqueous liquid chemical formulation may be different (i.e., may be separate components). In any case, the one or more non-aqueous liquid chemical formulations may be absent of the fluid used to subsequently pressurize the process chamber.

In some embodiments, the drying agent may be an ionic or non-ionic surfactant provided that the surfactant is amphiphilic toward a water/solvent mixture (i.e., the surfactant is soluble in the solvent of the non-aqueous liquid chemical formulation and is capable of emulsifying the water on the microelectronic topography). As such, in some cases, a non-aqueous liquid chemical formulation and, in some embodiments, resulting liquid formulation 56 may be referred to as surfactant-solvent mixtures. In other cases, the drying agent may be an alcohol or other type of drying agent. In general, the solvent of a non-aqueous liquid chemical formulation may include a polar or non-polar organic solvent or solvent mixture with a molecular weight less than approximately 150 au. Exemplary non-polar solvents include hexane, pentane, and heptane. Exemplary polar solvents include methanol, ethanol, propanol, isopropanol, and acetone.

In general, the drying agent serves to effectively reduce the surface tension of the aqueous liquid on the wafer. The dry agent is soluble in the solvent, but may or may not be soluble in the fluid used to subsequently pressurize the process chamber (i.e., the fluid used in the process outlined in block 20 of FIG. 1 and described in more detail below). In cases where the drying agent is not soluble in the fluid used to subsequently pressurize the process chamber and is part of a non-aqueous liquid formulation used at the end of process 54, the method may include adding a pure flow of the solvent to the microelectronic topography prior to pressurizing the process chamber as denoted in block 18 of FIG. 1. Such a process may serve to substantially remove the drying agent from the microelectronic topography and the chamber before introducing the fluid for pressurizing the process chamber. It is noted that block 18 in FIG. 1 is outlined by a dotted line, indicating such a process is dependent on the parameters of the fabrication process.

Similar to rinse process 50, process 54 may in some embodiments employ a single non-aqueous liquid chemical formulation (i.e., a single non-aqueous liquid chemical formulation without having its composition altered during process 54). In alternative embodiments, process 54 may employ multiple and different non-aqueous liquid chemical formulations successively added to microelectronic topography 40. In particular, process 54 may include sequentially adding non-aqueous liquid formulations having varying concentrations of one or more chemicals to microelectronic topography 40. For example, a 3:1 ratio of hexane and ethanol (or, alternatively, a 3:1 ratio of ethanol to hexane) may be added followed by 100% hexane. In yet other cases, process 54 may include gradually changing the composition of a non-aqueous liquid chemical formulation added to the microelectronic topography (e.g., by changing the concentration of a solvent in the solution). In this manner, the solution on the microelectronic topography may be changed in a linear fashion as opposed to a graduated manner. For example, a solution having 100% ethanol may be first added to the microelectronic topography and then increasing amounts of hexane may be added to the flow of ethanol as the process progresses, in effect gradually lowering the concentration of ethanol within the formulation. It is noted that the number of solvents and the number of formulations thereof added to the topography as well as the relative amounts and the citation of ethanol and hexane noted above are merely cited for exemplary purposes and, thus, the methods described herein should not be limited to such examples.

As noted above in reference to block 14 in FIG. 1, microelectronic topography 40 may in some embodiments be transferred to a process chamber in between intermediate stages of aqueous rinse process 50 or prior to selective etch process 48. In such cases, process 54 may in some embodiments begin by adding a formulation having a solvent which was formulated in an aqueous rinse formulation and used in a latter stage of rinse process 50. For example, in an embodiment in which rinse process 50 ends with an addition of an aqueous solution comprising ethanol (e.g., having approximately 5% water and approximately 95% ethanol), process 54 may begin by adding a non-aqueous formulation comprising ethanol (e.g., a solution of 100% ethanol). It is believed such a transition of the two processes may advantageously allow the solution on microelectronic topography 40 to be substantially homogeneous and, thus, distinct liquid-liquid interfaces of liquids may be avoided, which as described in more detail below may aid in preventing feature collapse.

After spent liquids created from the processes outlined in blocks 14 and 16 in FIG. 1 have been largely removed from the process chamber, the method proceeds to block 20 at which a fluid is introduced in a gas state into the process chamber. The process includes pressurizing the chamber with the fluid until a chamber pressure equal to or greater than a saturated vapor pressure of the fluid or the critical pressure of the fluid is attained. The fluid may include any fluid having (or having the ability to attain) substantially low surface tension (e.g., less than approximately 30 dynes/cm) or no surface tension. Supercritical fluids and fluids near supercritical state generally have low viscosities and, thus, little or no surface tension. As such, the fluid used to pressurize the process chamber may generally include any fluid having a thermodynamic critical point which is relatively easy to attain (i.e., having a relatively low critical temperature and critical pressure). Exemplary fluids may include but are not limited to carbon dioxide and sulfur hexafluoride.

As set forth in more detail below in reference to block 32 of FIG. 1, the method includes providing a heated environment within the process chamber at some point in the sequence of process steps such that the fluid used to pressurize the chamber is at or above its critical temperature for the venting process outlined in block 34 of FIG. 1. Due to carbon dioxide's relatively low critical temperature of 31° C., it may be beneficial to use carbon dioxide to pressurize the process chamber. In particular, it may be desirable to minimize the temperature required for processing such that heating mechanisms (i.e., heat exchangers or heaters internal to the process chamber) may be minimized. Such considerations may be particularly advantageous for process chambers requiring the complexities to generate and withstand pressures greater than approximately 1000 psig, as discussed for the process chamber used for the methods described herein. Furthermore, carbon dioxide is relatively inexpensive compared to other fluids having a thermodynamic critical point which is relatively easy to attain and, thus, for that reason alone it may be desirable to employ carbon dioxide to pressurize the process chamber in some embodiments.

Figure 9:
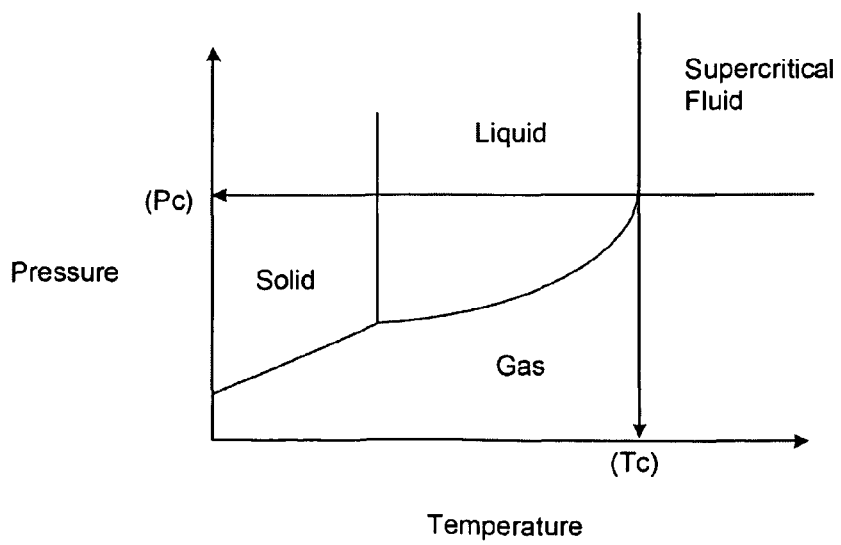
FIG. 9 depicts a pressure-temperature phase diagram of carbon dioxide.

As noted above, the fluid is introduced into the process chamber until at least the fluid within the chamber reaches saturated vapor pressure or critical pressure. As such, depending on whether the fluid within the process chamber is below or above its critical temperature during the pressurizing step, the fluid may respectively assume a liquid state or a supercritical state. Such a phenomenon for carbon dioxide is depicted in the pressure-temperature phase diagram of FIG. 9. Although pressure within the process chamber may be dependent on the temperature of carbon dioxide within the process chamber, an exemplary range of pressure to which the process chamber may be pressurized with carbon dioxide, for example, may be between approximately 800 psig and approximately 4000 psig. In some embodiments, the pressure range the process chamber may be pressurized with carbon dioxide may be between approximately 800 psig and approximately 2900 psig. In cases in which the temperature of carbon dioxide within the process chamber is above its critical temperature and, thus, a supercritical state is attained upon pressurizing the chamber, an exemplary range of pressure to which the process chamber may be pressurized with carbon dioxide may be between approximately 1100 psig and approximately 4000 psig and, more specifically, between approximately 1500 psig and approximately 2900 psig.

As shown in block 22 of FIG. 1, the pressurizing process outlined in block 20 may include an accompanying step of keeping device structures 44 submerged to insure microelectronic topography 40 is not dried and/or device structures 44 are not exposed prior the process chamber being pressurized with the fluid referenced in block 20. As further noted in block 22, such a process may include keeping device structures 44 submerged in a liquid which includes at least one component of the one or more non-aqueous liquid chemical formulations referred to in block 16. In some embodiments, such a process step may include keeping device structures 44 submerged in liquid formulation 56 created by the addition of the one or more non-aqueous liquid chemical formulations referred to in block 16 of FIG. 1 and shown in FIG. 5. In particular, the depth of liquid formulation 56 created by process 54 may be sufficient to keep device structures 44 submerged during the pressurizing process. In yet other embodiments, the process referred to in block 22 may include adding one or more components of the one or more non-aqueous liquid chemical formulations to microelectronic topography 40, such as but not limited to a solvent used in a latter stage of process 54 at a flow rate of less than 25% of the flow rate of the fluid used to pressurize the process chamber. The latter scenario may be particularly applicable if the depth of liquid formulation 56 created in reference to block 16 is not sufficient to prevent microelectronic topography 40 from being dried and/or device structures 44 from being exposed during the pressurizing process.

For reasons similar to those described in reference to block 16, it may be advantageous, in some embodiments, to keep device structures 44 submerged below a liquid-gas interface between liquid formulation 56 and the pressurizing gas in the process chamber by at least approximately 3 mm and, in some cases, between approximately 3 mm and approximately 25 mm and, more specifically, between approximately 5 mm and approximately 12 mm. In some cases, however, smaller submersion buffers may be considered. In yet other embodiments, similar to the discussions for the process described in reference to block 16, keeping device structures 44 submerged during the pressurizing process is not necessarily required for the methods described herein. In particular, the methods may alternatively keep liquid upon microelectronic topography at a level below the upper surfaces of device structures 44 for the pressurizing process.

As noted above and in block 20 of FIG. 1, the fluid is introduced in the process chamber in a gas state. In this manner, a distinguishing liquid-liquid interface between the fluid and liquid formulation 56 may be avoided. In particular, it is the general objective to incorporate the fluid into liquid formulation 56 during the processes outlined in blocks 20, 24, and 26 such that liquid formulation 56 may be gradually diluted. Such an incorporation of the fluid may be attainable by introducing the fluid in a gas state into the process chamber. Conversely, adding the fluid in a liquid state may generally form a distinguishing liquid-liquid interface between the fluid and liquid formulation 56, preventing the incorporation of the fluid into liquid formulation 56 and, thus, inhibiting the dilution of liquid formulation 56. It is theorized that device structures 44 may be more susceptible to collapse if a distinguishing liquid-liquid interface exists between the fluid and liquid formulation 56, since the structures are likely to be exposed to the liquid-liquid interface when flushing liquid formulation 56 from the topography. Moreover, a liquid-liquid interface may be relatively transient and, therefore, device structures 44 may be susceptible to exposure to the liquid-liquid interface even before flushing. It is believed that the interfacial tension of a liquid-liquid interface may be as high as a liquid-gas interface and, thus, may be as likely to cause feature collapse.

As noted above, the methods described herein in some embodiments include pressurizing the process chamber to a pressure equal to a saturated vapor pressure of a fluid (i.e., when the temperature of the process chamber is below the critical temperature of the fluid added thereto) and, thus, the fluid in a liquid state may be generated in the process chamber. Such a process, however, does not necessarily create a distinguishable liquid-liquid interface between the fluid and liquid formulation 56. As noted above, the introduction of the fluid in a gas state serves to incorporate the fluid into liquid formulation 56 while pressurizing the process chamber. Upon attaining saturated vapor pressure, the fluid transforms into a liquid state and, thus, the introduction of the fluid in the process chamber in effect facilitates mixing the fluid in a liquid state with the resulting liquid formulation upon attaining saturated vapor pressure. Although the process of pressurizing the process chamber (i.e., introducing the fluid into the process chamber in a gas state and eventually transforming the fluid into a liquid state) may generally be sufficient to prevent the formation of a liquid-liquid interface, in some cases liquid formulation 56 may be specifically configured to further minimize or prevent the formation a liquid-liquid interface. In particular, liquid formulation 56 may, in some embodiments, include a material which increases the dispersion forces of the two fluids, such as a surfactant.

As noted above and in block 32 of FIG. 1, the method includes providing a heated environment within the process chamber at some point in the sequence of process outlined in blocks 14-30 of FIG. 1 such that the fluid used to pressurize the chamber is at or above its critical temperature for the venting process outlined in block 34 of FIG. 1. In this manner, the fluid used to pressurize the process chamber may assume a supercritical state for the venting process. For instance, the process chamber may be heated to a temperature greater than or equal to approximately 31° C. when carbon dioxide is used pressurize the process chamber or, alternatively, to a temperature greater than or 45.5° C. when sulfur hexafluoride is used pressurize the process chamber.

As noted above, heating mechanisms for a process chamber which are configured to generate and withstand pressures greater than approximately 1000 psig may be complex, particularly for requirements of high temperatures. Furthermore, the amount of energy needed to heat a process chamber may generally increase exponentially with temperature requirements. As such, it may be advantageous, in some embodiments, to minimize the temperature at which to heat the process chamber to attain a supercritical state of the fluid. For example, when carbon dioxide is used to pressurize the process chamber, it may be advantageous to limit heating the process chamber to a temperature between approximately 31° C. and approximately 60° C. and, in some embodiments, between approximately 31° C. and approximately 40° C. Higher temperatures, however, may be employed. In some cases, it may be advantageous to heat the process chamber to a temperature range one or more degrees above the critical temperature of the fluid to insure a supercritical state of the fluid may be maintained for the venting process described in reference to block 34. For example, when carbon dioxide is used to pressurize the process chamber, it may be advantageous to heat the process chamber within a temperature range between approximately 35° C. and approximately 40° C. Other temperature ranges may be considered.

In some embodiments, the process of providing the heated environment (i.e., block 32) may be conducted subsequent to pressurizing the process chamber. In other words, the process of pressurizing the process chamber may be conducted within a temperature range below the critical temperature of the fluid. In such embodiments, the fluid will transform into a liquid state when a saturated vapor pressure within the process chamber is attained in relation to the process of block 20. An exemplary temperature range for pressurizing a process chamber in such a manner with carbon dioxide may generally include introducing the carbon dioxide into the process chamber at a temperature less than approximately 30° C. and, more specifically, between approximately 0° C. and approximately 20° C. Subsequent to attaining saturated vapor pressure within the process chamber, the temperature of the process chamber may be increased to a temperature equal to or above the critical temperature of the fluid. At the point of attaining critical temperature, the fluid will transform into a supercritical state. The supercritical state and, thus temperatures and pressures equal to or above the thermodynamic critical point of the fluid, is preferably maintained until at least the venting process described below in reference to block 34 is conducted.

In alternative cases, the process of providing the heated environment (i.e., block 32) may be conducted while pressurizing the process chamber and introducing the second flow of the fluid into the process chamber (i.e., steps 20, 24, and 26). In other embodiments, the process of providing the heated environment may be additionally conducted prior to or while adding one or more of the non-aqueous liquid chemical formulations to the microelectronic topography (i.e., block 16) and/or prior to or while transferring the microelectronic topography to the process chamber (i.e., block 14). In any case, the critical temperature may be maintained thereafter until at least the venting process described below in reference to block 34 is conducted. In this manner, the fluid will transform and remain in a supercritical state when the critical pressure of the fluid within the process chamber is attained.

An advantage of providing a heated environment such that the fluid is at or above its critical temperature prior to, during, and subsequent to pressurizing the process chamber is that it may be more time efficient to do so versus providing the heated environment after pressurizing the process chamber. As will be set forth in more detail below in reference to the process chamber illustrated in FIG. 8, due to the process chamber having to generate and withstand relatively high pressures, the process chamber may have substantially thick walls. Increasing the temperature within such a process chamber may take a substantial amount of time (e.g., on the order of 30 to 60 minutes), which may substantially delay the fabrication process and, thus, be undesirable for production yield. A disadvantage, however, of having the fluid at or above its critical temperature during the pressurizing process is a fluid is less than dense in its supercritical state than in its liquid state and, thus, may be less susceptible to mixing with liquid formulation 56. In order to mitigate such an issue, a drying agent may be added to the process chamber to reduce the interfacial tension of liquid formulation 56, allowing the supercritical fluid to be mixed with the liquid formulation. The drying agent may include a surfactant, an alcohol, or any other type of drying agent. In addition, the drying agent may be added during the pressurizing process referenced in block 20, during the addition of the pure flow of solvent referenced in block 18, and/or during the addition of one or more of the non-aqueous liquid chemical formulations referenced in block 16.

Regardless of when the fluid within the process chamber is heated to its critical temperature, the method may, in some embodiments, continue to block 24 subsequent to attaining a chamber pressure at or greater than a saturated vapor pressure or the critical pressure of the fluid. In particular, a second flow of the fluid may be introduced into the process chamber. In some embodiments, the second flow of the fluid may be a pure flow of the fluid (i.e., without supplementary solvents or surfactants added to the process chamber as described for various embodiments of block 20). In this manner, the process chamber may be flushed of any supplementary chemicals added during the pressurizing process. In embodiments in which no supplementary chemicals were added during the pressurizing process, the process outlined in block 24 may in some cases be omitted and the introduction of the first flow of the fluid used to pressurize the process chamber may continue. In embodiments in which the second flow of the fluid is not a pure fluid, a third flow of pure fluid may be used prior to the venting process to ensure all processing adjuncts are removed.

Continuing to block 26, the process chamber is vented at approximately the same rate as introducing the second flow of the fluid such that pressure within the process chamber is maintained at or above saturated vapor pressure or critical pressure of the fluid. The process may be readily referred to as a "flow-through process" and includes flushing liquid formulation 56 from the process chamber as noted in block 28. In particular, venting process 58 shown in FIG. 6 invokes replacement of liquid formulation 56 with fluid 57, which is the fluid used to pressurize the process chamber in either a liquid state or a supercritical state depending on the temperature within the process chamber. After a period of time sufficient to substantially remove liquid formulation 56, the introduction of the second flow of the fluid is ceased as shown in block 30 of FIG. 1. In some embodiments, the venting process may cease as well. Ceasing the venting process of block 26 may be particularly applicable but not limited to instances when the fluid within the process chamber is not at its critical temperature. In this manner, the process chamber may be given time to increase the temperature of the fluid to assume a supercritical state for the subsequent vent process outlined in block 34. In alternative embodiments in which the fluid is at its critical temperature at block 30, the venting process may continue and be part of the venting process outlined in block 34.

The venting process outlined in block 34 and depicted as process 59 in FIG. 7 differs from the venting process 58 in that venting process 59 is used to either transform the supercritical fluid into a gas state or flush the supercritical fluid from the process chamber in a flow-through process. In either case, venting process 59 is conducted in a manner sufficient to prevent formation of a liquid in the process chamber. For example, in the first scenario, venting process 59 may be performed by venting the process chamber at a rate that allows direct transition of the fluid from the supercritical state to the gas state without formation of a liquid phase. In particular, the vent rate may be controlled to avoid expansion cooling leading to formation of liquid droplets in contact with microelectronic topography 40. In some cases, however, the transition process may be time consuming, such as when carbon dioxide is the supercritical fluid. In particular, supercritical carbon dioxide has a high Joule-Thompson coefficient of expansion, which means that large amounts of heat are consumed as the fluid expands in the gas phase. This may be problematic if a fast venting process (e.g., less than approximately 1 minute) is desired since the cooling associated with expansion leads to liquid carbon dioxide formation that either boils to a gas or transitions back to supercritical phase depending on the pressure in the process chamber. In either case, the phase transition may lead to damage on delicate features of the microelectronic topography.

One method to achieve an accelerated venting process for block 34 is to use a different supercritical fluid to displace the supercritical fluid within the process chamber. Detailed descriptions of such a process are provided in U.S. Pat. No. 6,602,351 to DeYoung et al. and U.S. Pat. No. 6,905,555 to DeYoung et al., which are incorporated by reference as if fully set forth herein. The different supercritical fluid preferably has a lower density, critical temperature, and Joule-Thompson coefficient of expansion than the fluid within the process chamber. As a consequence, pressure with the process chamber can be reduced at a much faster rate without damage to features on the microelectronic topography. In addition, such a technique does not cause a liquid to be formed within the process chamber and, thus, concerns of feature collapse are abated. Exemplary supercritical fluids which may be used for an accelerated venting process include but are not limited to helium, argon, nitrogen, oxygen, and mixtures thereof.

In any case, after pressure within the process chamber has been reduced to atmospheric pressure or the ambient pressure of the environment in which the process chamber resides, the microelectronic topography may be dry and undamaged. Further processing of the microelectronic topography may ensue in the process chamber or in a different process chamber.

As noted above, FIG. 8 illustrates an exemplary process chamber for performing one or more of the process steps of the methods described herein. As shown in FIG. 8, process chamber 60 includes substrate holder 62 configured to support a microelectronic topography and further includes vessel 66 configured to contain substrate holder 62. In addition, process chamber 60 includes one or more fluidic line/s 68 for supplying wet chemistry to the vessel. The wet chemistry may include any of the liquid chemistries discussed in reference to the processes outlined in blocks 10-20 of FIG. 1, including but not limited to wet etch chemistry for selectively etching a sacrificial layer encasing device structures of a microelectronic topography, deionized water for rinsing an etched topography, one or more aqueous liquid formulations and one or more non-aqueous liquid chemical formulations for adding to a topography prior to being exposed to a pressurized environment, and/or supplementary chemistries, such as solvents or surfactants, added to a topography during any of the processes referenced in blocks 16-20. As shown in FIG. 8, process chamber 60 is configured such that a microelectronic topography arranged upon substrate holder 62 may be submerged within wet chemistry supplied to vessel 66. In this manner, device structures comprising an upper surface of a microelectronic topography may be submerged. Such configurations may include vessel 66 specifically positioned relative to substrate holder 62 and having sidewalls sufficient to provide a bath of ample depth to encompass substrate holder 62 and a microelectronic topography residing thereon.

As further shown in FIG. 8, process chamber 60 includes sealable region 70 surrounding substrate holder 62 and vessel 66. Region 70 may be sealed by gate 74 at which microelectronic topographies may be loaded and unloaded from the process chamber. In some embodiments, shaft 64 of substrate holder 62 may be moveable as denoted by the doubled arrow in FIG. 8 to aid in load and unload procedures. Process chamber 60 further includes one or more fluidic line/s 76 for supplying one or more gases to sealable region 70. The gases may include any of the fluids discussed in reference to the processes outlined in blocks 10-34 of FIG. 1, including gases for etching a sacrificial layer encasing device structures of a microelectronic topography as well as pressurizing the process chamber and venting the process chamber. In general, the process chamber is configured to generate and withstand pressures greater than approximately 1000 psig within sealable region 70. In this manner, the process chamber is configured to transpose gaseous fluids, such as carbon dioxide or sulfur hexafluoride, into a supercritical state within sealable region 70.

In general, sidewalls 72 are made up of materials able to withstand such pressures, such as metal. In order to insure the interior surfaces of sidewalls 72 are not degraded by the potentially corrosive nature of some of the wet chemistry that may be supplied to vessel 66, process chamber 60 is preferably configured to sequester wet chemistry supplied to the vessel from sidewall surfaces of the sealable region. Such configurations may include vessel 66 having sufficient depth to contain the wet chemistry about substrate holder 62 and a microelectronic topography residing thereon. In addition, fluid line/s 68 may be configured to extend into the confines of vessel 66. Moreover, vessel 66 may, in some embodiments, be configured with a detachable lid. In such cases, the detachable lid may be placed upon the vessel for wet processing a microelectronic topography and removed for exposure to fluids within sealable region 70. In any case, process chamber 60 may further include one or more heating mechanisms for heating sealable region 70. The one or more heating mechanisms may be of any form known to those skilled in the art including but not limited to heating coil 78 arranged along the interior of sidewalls 72 as shown in FIG. 8. In some embodiments, heat may be additionally or alternatively provided to process chamber 60 via the fluids introduced through fluidic lines 68 and 76. In particular, fluid storages supplying such fluids and/or the fluidic lines may be equipped with heating mechanisms.

As noted above, the components of process chamber 60 depicted in FIG. 8 are not necessarily drawn to scale and the chamber and the components comprising the chamber may include different configurations. In addition, process chamber 60 may include components which are not shown in FIG. 8. Such auxiliary components are not shown in the figure merely so the components shown and described may be emphasized.

It will be appreciated to those skilled in the art having the benefit of this disclosure that this invention is believed to provide methods and systems for preventing feature collapse within microelectronic topographies. Further modifications and alternative embodiments of various aspects of the invention will be apparent to those skilled in the art in view of this description. For example, although many of the examples described herein cite carbon dioxide as a fluid for pressurizing a process chamber and assuming a supercritical state, the methods and systems described herein are not so limited. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for processing a microelectronic topography, comprising:
    adding a non-aqueous liquid chemical formulation to a microelectronic topography having remnants of an aqueous liquid arranged upon its surface at approximately atmospheric pressure such that separated device structures comprising an upper surface of the microelectronic topography are submerged below a liquid-gas interface;
    pressurizing a process chamber comprising the microelectronic topography subsequent to the step of adding the non-aqueous liquid chemical formulation, wherein the step of pressurizing the process chamber comprises introducing a first flow of a fluid in a gas state into the process chamber until a chamber pressure equal to or greater than a preset pressure level is attained, wherein the preset pressure level is:
        a saturated vapor pressure value of the fluid when the fluid comprises a temperature less than the critical temperature of the fluid; and
        the critical pressure value of the fluid when the fluid comprises a temperature greater than the critical temperature of the fluid;
    keeping the separated device structures submerged in a liquid comprising at least one component of the non-aqueous liquid chemical formulation during the step of pressurizing the process chamber;
    introducing a second flow of the fluid into the process chamber without introducing supplementary solvents or surfactants into the process chamber at least subsequent to attaining a chamber pressure equal to or greater than the preset pressure level, wherein the step of introducing the second flow of the fluid into the process chamber comprises flushing from the microelectronic topography the liquid used to submerge the microelectronic topography during the step of pressurizing the process chamber;
    maintaining the process chamber at or above the preset pressure level during the step of introducing the second flow of the fluid into the process chamber;
    providing a heated environment within the process chamber such that the fluid within the process chamber is at a temperature equal to or above the critical temperature of the fluid at least subsequent to flushing the liquid from the microelectronic topography; and
    subsequently venting the process chamber in a manner sufficient to prevent formation of a liquid in the process chamber.

2. The method of claim 1, wherein the step of keeping the separated device structures submerged comprises submerging the microelectronic topography such that the upper surface of the microelectronic topography is below a liquid-gas interface between the liquid and the gas by at least approximately 3 mm.

3. The method of claim 1, wherein the step of adding the non-aqueous liquid chemical formulation to the microelectronic topography comprises submerging the microelectronic topography such that the upper surface of the microelectronic topography is below the liquid-gas interface by at least approximately 3 mm.

4. The method of claim 1, wherein the step of providing a heated environment within the process chamber is conducted during the steps of pressurizing the process chamber and introducing the second flow of the fluid into the process chamber.

5. The method of claim 1, wherein the step of pressurizing the process chamber is conducted at a first temperature below the critical temperature of the fluid, and wherein the step of providing the heated environment within the process chamber comprises increasing the first temperature of the process chamber to a second temperature equal to or above the critical temperature of the fluid subsequent to attaining the preset pressure level.

6. The method of claim 1, wherein the non-aqueous liquid chemical formulation comprises a solvent having functionality of a drying agent.

7. The method of claim 1, wherein the non-aqueous liquid chemical formulation comprises a solvent and a drying agent which is soluble in the solvent.

8. The method of claim 7, wherein the drying agent comprises a surfactant that is amphiphilic in the fluid.

9. The method of claim 7, wherein the drying agent is insoluble in the fluid, and wherein the method further comprises adding a flow of the solvent to the microelectronic topography without introducing other matter into the process chamber between the steps of adding the non-aqueous liquid chemical formulation to the microelectronic topography and pressurizing the process chamber.

10. The method of claim 1, wherein the step of keeping the separated device structures of the microelectronic topography submerged in the liquid comprises keeping the separated device structures submerged within a surfactant solvent mixture.

11. The method of claim 1, wherein the step of keeping the separated device structures of the microelectronic topography submerged in the liquid comprises introducing a solvent into the process chamber during the step of pressurizing the process chamber.

12. The method of claim 1, further comprising transferring the microelectronic topography having the remnants of aqueous liquid arranged upon its surface to the process chamber prior to the step of adding the non-aqueous liquid chemical formulation to the microelectronic topography.

13. The method of claim 1, further comprising:
loading a microelectronic topography comprising a sacrificial layer along its upper surface which encases a plurality of device structures into the process chamber;
selectively etching the sacrificial layer to expose sidewalls of the separated device structures; and
rinsing the etched microelectronic topography with an aqueous liquid formulation to form the microelectronic topography having the remnants of the aqueous liquid arranged upon its surface.

14. The method of claim 13, wherein the step of rinsing the etched microelectronic topography comprises successively rinsing the etched microelectronic topography with different aqueous liquid formulations.

15. The method of claim 13, wherein the step of rinsing the etched microelectronic topography comprises gradually changing the composition of the aqueous liquid formulation.

16. The method of claim 1, wherein the step of adding the non-aqueous liquid chemical formulation to the microelectronic topography comprises successively adding different non-aqueous formulations to the microelectronic topography.

17. The method of claim 1, wherein the step of adding the non-aqueous liquid chemical formulation to the microelectronic topography comprises gradually changing the composition of the non-aqueous formulation.

18. The method of claim 1, wherein the step of adding the non-aqueous liquid chemical formulation to the microelectronic topography comprises emulsifying the remnants of aqueous liquid such that the surface tension of resulting liquid formulations on the microelectronic topography is less than approximately 30 dynes/cm.

19. The method of claim 1, wherein the fluid is carbon dioxide.

20. A method for processing a microelectronic topography, comprising:
selectively etching an sacrificial layer encasing a plurality of device structures within a microelectronic topography;
rinsing the etched microelectronic topography with an aqueous liquid formulation;
transferring the microelectronic topography laced with the aqueous liquid formulation to a process chamber configured to generate and withstand pressures greater than approximately 1000 psig;
introducing a non-aqueous liquid chemical formulation absent of carbon dioxide into the process chamber and onto the microelectronic topography;
introducing a first flow of carbon dioxide in a gas state into the process chamber subsequent to the step of introducing the non-aqueous liquid chemical formulation into the process chamber and at least until carbon dioxide within the process chamber reaches saturated vapor pressure or critical pressure;
introducing a second flow of carbon dioxide into the process chamber at least subsequent to attaining saturated vapor pressure or critical pressure within the process chamber;
venting the process chamber during the step of introducing the second flow of carbon dioxide into the process chamber and at approximately the same rate as introducing the second flow of carbon dioxide such that a pressure within the process chamber is maintained at or above saturated vapor pressure or critical pressure;
ceasing the introduction of the second flow of carbon dioxide into the process chamber;
providing a heated environment within the process chamber such that carbon dioxide within the process chamber is at or above its critical temperature at least subsequent to the step of ceasing the introduction of the second flow of carbon dioxide into the process chamber; and
venting the process chamber in a manner sufficient to prevent formation of a liquid in the process chamber subsequent to the step of ceasing the introduction of the second flow of carbon dioxide into the process chamber.

21. The method of claim 20, wherein the step of introducing the non-aqueous liquid chemical formulation into the process chamber comprises submerging the transferred microelectronic topography with the non-aqueous liquid chemical formulation.

22. The method of claim 21, further comprising maintaining the microelectronic topography submerged within a liquid comprising at least one component of the non-aqueous liquid chemical formulation during the step of introducing the first flow of carbon dioxide into the process chamber.

23. The method of claim 22, wherein the step of maintaining the microelectronic topography submerged comprises maintaining the microelectronic topography submerged such that the upper surface of the microelectronic topography is below a liquid-gas interface by at least approximately 3 mm.

24. The method of claim 20, wherein the step of rinsing the etched microelectronic topography comprises successively rinsing the etched microelectronic topography with different aqueous liquid formulations.

25. The method of claim 20, wherein the step of rinsing the etched microelectronic topography comprises gradually changing the composition of the aqueous liquid formulation.

26. The method of claim 20, further comprising successively introducing one or more additional and different non-aqueous liquid chemical formulations into the process chamber and onto the microelectronic topography prior to the step of introducing the first flow of carbon dioxide into the process chamber.

27. The method of claim 20, wherein the step of adding the non-aqueous liquid chemical formulation to the microelectronic topography comprises gradually changing the composition of the non-aqueous formulation.

28. The method of claim 20, wherein the step of introducing the first flow of carbon dioxide into the process chamber comprises introducing carbon dioxide into the process chamber within a temperature range below its critical temperature, and wherein the step of providing the heated environment within the process chamber comprises increasing the temperature of the process chamber subsequent to attaining saturated vapor pressure within the process chamber.

29. The method of claim 28, wherein the step of introducing the first flow of carbon dioxide into the process chamber comprises introducing carbon dioxide into the process chamber at a temperature between approximately 0° C. and approximately 20° C., and wherein the step of introducing the second flow of carbon dioxide into the process chamber comprises introducing the second flow of carbon dioxide into the process chamber at a temperature above approximately 35° C.

30. The method of claim 20, wherein the step of providing a heated environment within the process chamber is further conducted at least during the steps of introducing the first and second flows of the fluid into the process chamber.

31. The method of claim 20, wherein the steps introducing the first and second flows of carbon dioxide into the process chamber comprise introducing carbon dioxide into the process chamber at temperatures equal to or above the critical temperature of carbon dioxide.

\* \* \* \* \*

UNITED STATES PATENT AND TRADEMARK OFFICE
CERTIFICATE OF CORRECTION

PATENT NO. : 8,153,533 B2  
APPLICATION NO. : 12/237070  
DATED : April 10, 2012  
INVENTOR(S) : DeYoung et al.

Page 1 of 1

It is certified that error appears in the above-identified patent and that said Letters Patent is hereby corrected as shown below:

On the title page, item (75) Inventors: Please add --Tony R. Kroeker, Georgetown, TX (US)--

Signed and Sealed this  
Second Day of April, 2013

Teresa Stanek Rea  
*Acting Director of the United States Patent and Trademark Office*